United States Patent
Gurrapu (10) Patent No.: US 7,492,848 B2
(45) Date of Patent: Feb. 17, 2009

(54) METHOD AND APPARATUS FOR EFFICIENT MULTI-STAGE FIR FILTERS

(75) Inventor: Srikanth Gurrapu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 573 days.

(21) Appl. No.: 11/105,275

(22) Filed: Apr. 13, 2005

(65) Prior Publication Data

US 2006/0233290 A1    Oct. 19, 2006

(51) Int. Cl.
  *H04L 7/00*    (2006.01)
(52) U.S. Cl. .................. 375/355; 375/230; 708/303; 708/319; 708/322; 341/61
(58) Field of Classification Search .......... 375/230, 375/232, 346, 350, 355; 708/300, 303, 319, 708/322, 323; 455/307; 341/61, 142, 144; 711/2, 105, 147
See application file for complete search history.

(56) References Cited

U.S. PATENT DOCUMENTS

| | | | |
|---|---|---|---|
| 5,610,942 A * | 3/1997 | Chen et al. | 375/242 |
| 5,995,542 A | 11/1999 | Goeckler | |
| 6,018,755 A | 1/2000 | Gonikberg et al. | |
| 6,035,320 A | 3/2000 | Kiriaki et al. | |
| 6,272,173 B1 | 8/2001 | Hatamian | |
| 6,427,158 B1 | 7/2002 | Wang et al. | |
| 6,834,292 B2 * | 12/2004 | Jiang et al. | 708/313 |
| 7,262,716 B2 * | 8/2007 | Yu et al. | 341/61 |

OTHER PUBLICATIONS

Haddad, R.A., et al., "Digital Signal Processing," W.H. Freeman and Co., 1991, pp. 202-234.
Coleman, J.O., et al., "Fractions in the Canonical-Signed-Digit Number System," 2001 Conference on Information Sciences and Systems, The Johns Hopkins University, Mar. 21-23, 2001, pp. 1-2.
Liberali, V. et al., "Digital Decimation Filters," MIXMODEST Workshop, Sep. 17, 1999, pp. 1-21, Pavia, Italy.

* cited by examiner

*Primary Examiner*—Dac V Ha
(74) *Attorney, Agent, or Firm*—Warren J. Franz; Frederick J. Telecky, Jr.; Wade J. Brady, III (57) ABSTRACT

An interpolation filter without a FIFO memory is configured as a cascade arrangement of simpler interpolation sub-filters that are operated in reverse order. The interpolation sub-filter that produces the highest sampling frequency is operated first, followed by interpolation sub-filters that operate at successively lower sampling frequencies. Computational independence of the cascaded sub-filters is guaranteed by adding delays to sampled and filtered signals. Delays are implemented by operating each of the cascaded sub-filters using prior filtering results that are computed during a previous sampling interval. A small increment to random-access memory is required for storing the successively delayed signals. The digital signal processor performing the filtering process is stalled for one clock cycle at the time a filtered signal sample is outputted so that the outputted signal sample can be produced without a timing conflict.

20 Claims, 5 Drawing Sheets

METHOD AND APPARATUS FOR EFFICIENT MULTI-STAGE FIR FILTERS

TECHNICAL FIELD

This invention relates generally to hardware and software implementations of digital discrete-time signal processing filters, and, in particular, to a method and implementation of finite-time impulse response (FIR) digital filters configured with an integrated circuit or with software, or a combination thereof.

BACKGROUND

Linear filters implemented with digital signal processing, generally with constant coefficients, are widely used in electronic systems, particularly in systems configured with digital logic. For example, digital filters are widely used in high fidelity audio systems, cellular telephones, speakerphones, high performance television and radio receivers, speech recognition, and numerous other applications requiring linear processing of a band-limited signal.

Digital interpolation filters are generally included in system designs to increase a signal sampling rate before a digital-to-analog (D/A) conversion process. The Nyquist rate, as is well understood in the art, is the minimum sampling rate for a band-limited signal without losing its information content. However, upsampling ("interpolating") a band-limited signal to rates beyond the Nyquist rate allows D/A conversions with fewer bits of precision than are used for the original signal while preserving the original signal's information content. Reducing the number of bits in D/A converters often results in substantial cost reduction for a D/A device and increased conversion speed. Thus, generating oversampled signals is a frequent design approach in high performance systems such as high performance audio reproduction systems.

To achieve high filtering performance such as a flat pass band, a flat stop band, and a steep inter-band transition, high order filters are required. For example, the number of filter delay taps required to implement an FIR filter with a pass-band ripple of $\pm r_1$ centered around unity, a stop-band ripple of $\pm r_2$ centered around zero, a transition bandwidth of $F_{transition}$ Hz, and a sampling frequency of $F_{sampling}$ Hz is approximately, as described in R. A. Haddad, et al., "Digital Signal Processing: Theory, Applications and Hardware," W.H. Freeman and Co., 1991, p. 199

$$\frac{-10 \cdot \log_{10}(r_1 \cdot r_2) - 13}{14.6 \cdot \frac{F_{transition}}{F_{sampling}}} + 1,$$

which demonstrates the rapid growth of the number of taps necessary to implement a filter as its transition bandwidth is reduced. Thus, high performance digital filters with more than 50 or 100 taps are not uncommon for known filters with narrow transition bandwidths.

Filters configured with many taps inherently require that a significant number of digital operations be performed at a high repetition rate. This, in turn, requires that substantial chip area must be dedicated when a high-order filter is implemented with an integrated circuit, or else a high performance digital signal processor must be designed into the end product. Either of these alternatives can result in recognizable cost and power increases in the end product, and, for portable systems, a reduction in battery life.

Digital filters are usually implemented with finite-duration impulse response (FIR) filters, so named because an input signal with a limited time duration produces an output signal with a limited time duration. FIR filters, unlike infinite-duration impulse response (IIR) filters, do not exhibit stability problems because their non-recursive structure produces an output signal that only depends on ordinary numerical operations on an input signal, and with limited time delays. FIR filters have no corresponding lumped-parameter analog equivalent. FIR filters are less dependant on numerical quantization and, unlike IIR filters, can be easily designed without substantial phase error that would otherwise contribute to waveform distortion of the output signal. FIR filters are often easier to design than IIR filters because their coefficients are precisely their impulse responses. But a high performance FIR filter, like a corresponding IIR filter, bears a system cost for substantial numerical computation, particularly for multiplication of the input signal by a filter coefficient for each of the many filter taps, making a recognizable contribution to the cost of the end product.

A broad research effort has been made over the past decades to reduce the necessary computation for digital filters, particularly for high-order FIR and IIR filters, and has produced several significant results. An article by J. O. Coleman, et al., "Fractions in the Canonical-Signed Digit Number System," 2001 Conf. on Information Sciences and Systems, Mar. 21, 2001, pp. 1-2, which is referenced and incorporated herein, describes the use of canonical signed digits (CSD) for the representation of binary numbers. Using a CSD representation recognizes and takes advantage of the fact that subtraction is no more complex than addition in binary arithmetic and both are much simpler than multiplication which is generally implemented with a series of resource-consuming shifts and adds corresponding to the number of "1" bits in the multiplier.

Other prior research efforts have produced further simplifications to the computation necessary to support FIR and IIR filters and include:

using FIR filters with symmetrical (or anti-symmetrical) impulse response that inherently maintain linear phase delay in the output signal. Such filters can be implemented with half as many multiplications as a non-symmetrical filter.

using "half-band filters," which are FIR filters that have transforms that are even functions of frequency and which have odd symmetry about a half-bandwidth point, which produce both a symmetric impulse time response as well as zero impulse time response for the even-numbered time steps, obviating the need to calculate the response at the even-numbered points.

structuring decimation and interpolation filters as a series of cascaded stages, with each stage operating with smaller steps of decimation or interpolation, and configuring the more rapidly executed steps with lower order sub-filters. (Decimation and interpolation filters are digital filters that reduce or increase the number of sample points of an input signal by a factor of M, and typically constrain M to be $2^n$ where n is an integer exponent.)

using efficient digital structures such as tree adders, Homer's nested multiplication, etc., and general custom logic to perform arithmetic operations in minimal time.

Despite these advances in digital filter implementations, a remaining obstacle to low cost filter design, particularly for interpolation filters, is the need to include a dual-port FIFO ("first in/first out") memory to supply the output data in a real-time application of a filter configured as a sequence of simpler, cascaded sub-filters, where each sub-filter operates on the output of the previous filter, and each sub-filter operates at a different repetition rate. The need for FIFO memory arises in systems configured to use a selectable upsampling rate because the timing for availability of delayed and filtered samples in the digital computation depends on the selected upsampling rate, and leads to impractical or essentially unworkable circuit or software logical structures in these flexible arrangements, or else to designs that are not cost effective for the marketplace. A dual-port FIFO memory in prior-art designs provides the interface between an ALU (arithmetic and logic unit) that performs the actual filter calculation for the cascaded sub-filters operating at the different repetition rates and the digital logic (the "glue" logic) that outputs the selected filtered samples from the cascaded sub-filters in the right order, and at the right time. Dual-port FIFO memories are a significant cost element in digital filter designs, particularly for high-order filters, usually requiring substantial die area for their implementation. A dual-port FIFO memory often consumes as much as 30% of the die area for a custom chip that can perform flexible upsampling, for example, a device that can selectively execute multiple upsampling rates for high performance, multi-channel audio applications. The additional area for a FIFO memory is important because systems may be configured with six or more independent audio channels, each requiring a separate interpolation filter. A significant contributor to the substantial die area required by filters with FIFO memory is the need for extensive interconnections between portions of the operative filter logic that are inherently separated on the die. FIFO memory macros also require special power and ground structures around them, adding to the real estate on the die. For custom filters that operate at only one upsampling rate such as sample rate doubling, extensive logical design can sometimes be included in the device to avoid the FIFO memory problem. But a majority of designs that can accommodate flexible upsampling rates have not avoided this problem.

Thus, the prior art approach uses a digital interpolation filter to produce a filtered output signal at a higher sampling rate than the sampling rate of an input signal, and a known simplification of a digital interpolation filter uses a cascade arrangement of simpler interpolation sub-filters that each perform a smaller interpolation step, such as 2:1 interpolation, for a larger step of interpolation, such as 8:1 interpolation. The first cascaded interpolation sub-filter of the prior art operates on the input sampled data sequence and produces a filtered signal at twice the input signal sampling rate. The first cascaded interpolation sub-filter is followed by a second cascaded interpolation sub-filter that operates on the interpolated signal produced by the first interpolation sub-filter and produces a filtered signal at four times the sampling rate. The second cascaded interpolation sub-filter is followed, in turn, by a third cascaded interpolation sub-filter that produces a signal at eight times the sampling rate, etc. Thus, the first cascaded interpolation sub-filter operates on the input signal and produces an interpolated signal at a higher sampling rate, followed by a second interpolation sub-filter that operates on the interpolated signal and produces a further interpolated signal at a yet higher sampling rate, etc., which makes each succeeding filtering stage dependent on the previous filtering stage, and determines the necessary order in which each stage must be executed. In addition, the entire computation must be completed before the first filtered output signal is required, i.e., at the highest repetition rate. The prior art may also use CSD and other digital efficiencies to reduce the computational load for a digital filter. To accommodate a flexible over-sampling rate for the filtered output signal, the prior art necessarily uses a dual-port FIFO memory with its attendant cost in device area to provide the output signal samples in the correct sequence and with the correct timing.

A need thus exists for a filter design that can eliminate the dual-port FIFO memory for filters configured with cascaded sub-filtering stages. Digital interpolation and decimation filter implementations such as FIR filter implementations configured with cascaded stages, particularly in systems requiring removal of spectral components that produce aliasing after interpolation or decimation of an input sampled signal, can benefit from designs that do not have need for a dual-port FIFO memory.

SUMMARY OF THE INVENTION

Embodiments of the present invention achieve technical advantages by configuring an interpolation filter as a cascade arrangement of simpler interpolation sub-filters, and operating the simpler sub-filters in reverse order as compared to the prior art. Preferably, the sub-filters are FIR filters. The interpolation sub-filter that produces the highest sampling frequency is operated first, followed by interpolation sub-filters that operate at lower sampling frequencies. Preferably, the second and any following interpolation sub-filters provide filtered samples at successively lower sampling rates. Thus the present invention operates the cascaded interpolation sub-filters in the reverse order of the prior art. The present invention guarantees computational independence of the cascaded interpolation sub-filters by adding required delays to sampled and filtered signals. The present invention guarantees computational independence by operating each of the cascaded sub-filters using prior filtering results computed during a previous sampling interval. Preferably, the cascaded sub-filters use prior filtering results computed during the immediately previous sampling interval. Preferably, the present invention uses increased memory for the sampled and filtered signals as necessary for storing successively delayed signals, which guarantees computational independence of the cascaded sub-filters, and to correctly sequence the output signal samples. The present invention preferably stalls the digital signal processing engine for one clock cycle at the time to output a signal sample so that the signal sample can be correctly produced without a timing conflict. Preferably, the present invention uses a microprocessor to perform digital computation; a microprocessor can be configured as a digital signal processor (DSP) to execute the computation more efficiently. The present invention can be implemented with an application-specific integrated circuit (ASIC).

In accordance with another preferred embodiment of the present invention, a system is configured with an interpolation filter that uses a cascade arrangement of simpler interpolation sub-filters, and operates the simpler sub-filters in reverse order of conventional designs. The interpolation sub-filter that produces the highest sampling frequency is operated first, followed by interpolation sub-filters that operate at lower sampling frequencies. Preferably, the second and any following interpolation sub-filters provide filtered samples at successively lower sampling rates. Thus the present invention operates the cascaded interpolation sub-filters in the reverse order of the prior art. The present invention guarantees computational independence of the cascaded interpolation sub-filters by adding required delays to sampled and filtered signals. The present invention guarantees computational independence by operating each of the cascaded sub-filters using prior filtering results computed during a previous sampling interval. Preferably, the cascaded sub-filters use prior filtering results computed during the immediately previous sampling interval. Preferably, the present invention uses increased memory for the sampled and filtered signals as necessary for storing successively delayed signals, which guarantees computational independence of the cascaded sub-filters, and for correctly sequencing the output signal samples. The present invention preferably stalls the digital signal processing engine for one clock cycle at the time to output a signal sample so that the signal sample can be correctly produced without a timing conflict. Preferably, the system of the present invention uses a microprocessor to perform digital computation; a microprocessor can be configured as a digital signal processor (DSP) to execute the computation more efficiently. The system of the present invention can be implemented with an application-specific integrated circuit (ASIC).

Another embodiment of the present invention is a method of configuring an interpolation filter as a cascade arrangement of simpler interpolation sub-filters, and operating the sub-filters in reverse order. The method includes operating the sub-filter that produces the highest sampling frequency first, followed by operating the sub-filters that operate at lower sampling frequencies. Preferably, the method includes configuring the second and any following sub-filters to provide filtered samples at successively lower sampling rates. Thus the method of the present invention includes operating the cascaded interpolation sub-filters in the reverse order of the prior art. The method of the present invention guarantees computational independence of the cascaded interpolation sub-filters by adding required delays to sampled and filtered signals. The method of the present invention guarantees computational independence by operating each of the cascaded sub-filters using prior filtering results computed during a previous sampling interval. Preferably, the method includes configuring the cascaded sub-filters to use prior filtering results computed during the immediately previous sampling interval. Preferably, the method includes using increased memory for the sampled and filtered signals as necessary for storing successively delayed signals, which guarantees computational independence of the cascaded sub-filters, and for correctly sequencing the output signal samples. The method preferably includes stalling the digital signal processing engine for one clock cycle at the time to correctly output a signal sample so that the signal sample can be correctly produced without a timing conflict. Preferably, the method includes using a microprocessor to perform digital computation. The method preferably includes configuring the microprocessor as a DSP to execute the computation more efficiently. The method further preferably includes implementing the digital computation with an ASIC.

Embodiments of the present invention achieve technical advantages as a digital interpolation filter that does not require a FIFO memory, particularly a dual-port FIFO memory that can be implemented with reduced device area. Advantages of embodiments of the present invention include a digital interpolation filter that can be implemented with reduced manufacturing cost, or with software with reduced requirements for speed of execution.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention will be described with respect to preferred embodiments in a specific context, namely a digital FIR interpolation filter configured with cascaded interpolation stages (sub-filters) that eliminate the need for a first in-first out (FIFO) memory for the output signal. The filter includes added signal delays between the cascaded sub-filter stages to guarantee computational independence of the cascaded stages in order to accommodate operating them in reverse order. The interpolation filter is preferably operable with a selectable interpolation rate. Alternative embodiments include decimation filters as well as filters that may be configured as IIR filters.

Figure 1:
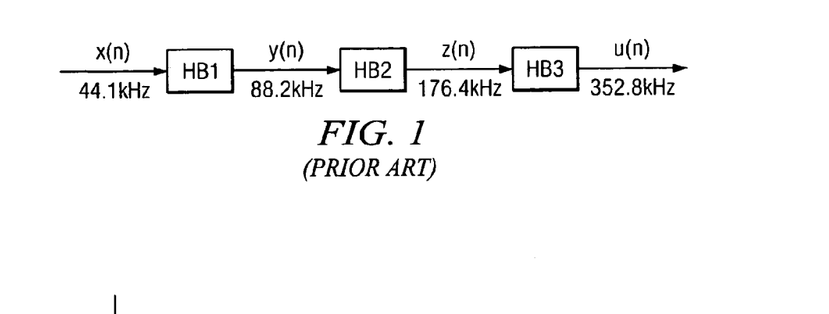
FIG. 1 illustrates a cascade arrangement of three interpolation sub-filters of the prior art.

Turning to FIG. 1, illustrated is an exemplary arrangement of three cascaded interpolation sub-filters of the prior art that produces an output signal u(n) upsampled to 352.8 kHz from an input signal x(n) sampled at 44.1 kHz. Audio signals on CDs (compact discs) are generally sampled at 44.1 kHz with 16 bits of precision. Such audio signals are band-limited to about 20 kHz, and, accordingly, a sampling process at 44.1 kHz properly exceeds the Nyquist sampling rate, which preserves the information content of the original signal. Such sampled signals are frequently upsampled to higher sampling rates such as 352.8 kHz (i.e., they are substantially "oversampled" with respect to the Nyquist sampling rate) so that the number of bits in digital-to-analog (D/A) converters can be correspondingly reduced without losing signal information. Reducing the number of bits in D/A converters substantially simplifies their design. Ideally, sufficient upsampling allows the use of a one-bit D/A converter. One-bit D/A conversion accommodates use of a high efficiency, class D amplifier to drive a loudspeaker that can have a substantial benefit in the design of high performance audio reproduction systems.

The cascade arrangement of interpolation sub-filters HB1, HB2, and HB3 illustrated in FIG. 1 is configured to produce an upsampled signal y(n) at 88.2 kHz by the first sub-filter HB1. The sub-filters HB2 and HB3 successively produce upsampled signals z(n) and u(n) at 176.4 kHz and 352.8 kHz, respectively. The implementation of filters with cascaded stages allows a selectable upsampling rate for application flexibility for different system designs, which necessitates the inclusion of a FIFO memory device in prior-art approaches. The sub-filters HB1, HB2, and HB3 are generally configured as half-band filters to take advantage of the even coefficients of such filters being zero and the opportunity to delete half of the filter delay taps. The cutoff frequencies of half-band filters are at mid-band for such filters designed as low pass filters, and have equal ripple attenuation in their pass bands and stop bands.

Figure 2:
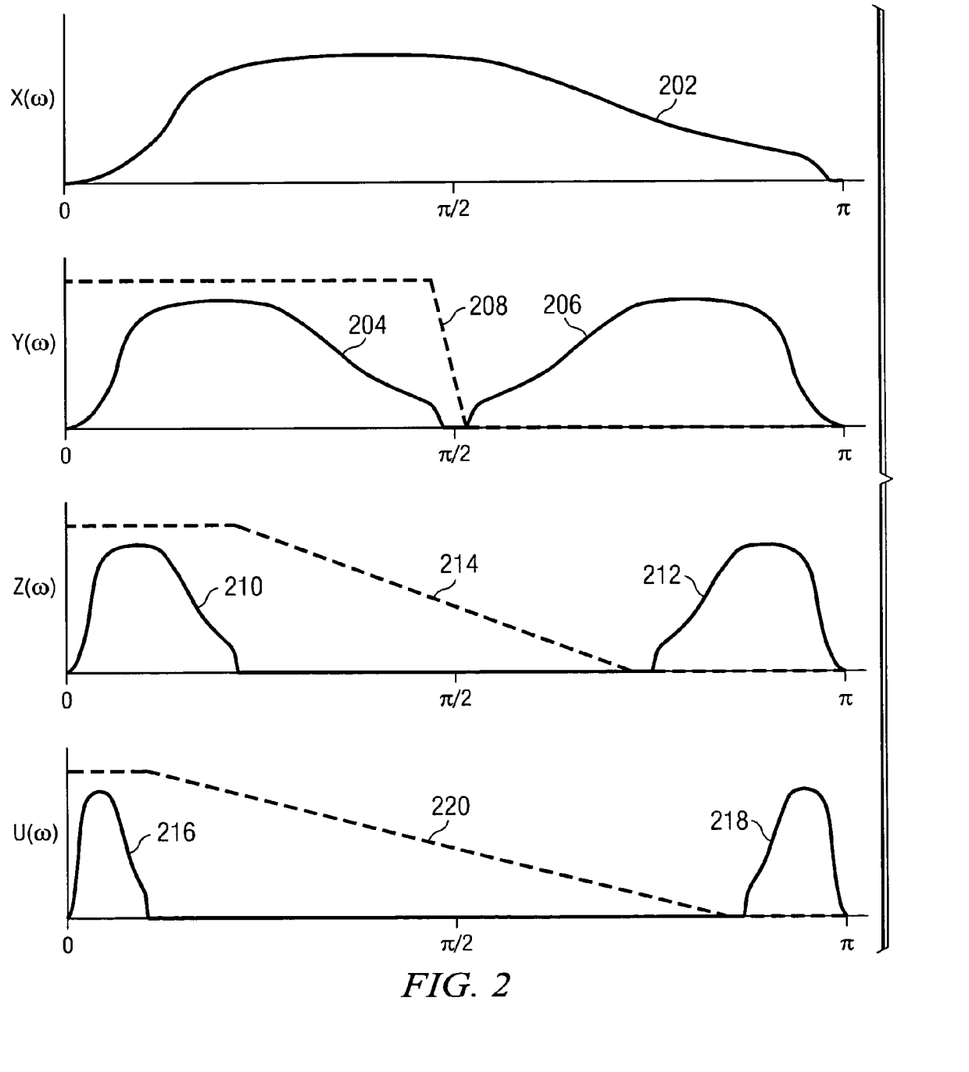
FIG. 2 illustrates amplitude spectra of successively interpolated signals and filter gains for a cascaded filtering process.

Interpolation filters are generally configured as a cascade arrangement of simpler sub-filters with smaller upsampling steps to obtain significant reduction in the required digital computation by relying on the spectral characteristics of successively interpolated and filtered signals. Turning to FIG. 2, illustrated is a representative amplitude spectrum 202 of a band-limited input signal $X(\omega)$. If the time-domain signal $x(n)$ corresponding to the frequency-domain signal $X(\omega)$ is interpolated to increase its sampling rate by a factor of two by inserting a zero between each signal sample, the resulting amplitude spectrum is illustrated by the signal $Y(\omega)$ (in the frequency domain), which consists of the original spectrum 202 scaled as the half bandwidth spectrum 204 plus the half bandwidth mirror image spectrum 206. The process of "inserting zeros" is a virtual or conceptual process that requires no actual effort. To remove the spurious spectrum 206 added by inserting zeros in the time domain, a low-pass filter with amplitude-frequency characteristic 208 is used, which requires the sharp transition shown between its passband gain and its stop-band gain, illustrated by the sharply sloped gain transition at $\pi/2$ in the figure. A filter with narrow-transition bandwidths requires many taps and delays for its implementation, such as a half-band filter with 99 taps and 50 delays. Fortunately, this sub-filter only operates at the relatively low sampling rate of the input signal $x(n)$, 44.1 kHz.

The second cascaded sub-filter, HB2, inserts zeros between the output samples of the first sub-filter HB1 before producing its output, $z(n)$, which generates a signal with spectral amplitude vs. frequency characteristic $Z(\omega)$, with low frequency components 210 and high-frequency components 212. These frequency components are separated by substantial bandwidth, and the upper frequency portion 212 can be easily removed by a low-pass filter with a longer transition bandwidth, 214. Such sub-filters might be implemented with 15 taps and 8 delays. However this second filter, which is substantially less complex than the first, operates at twice the sampling rate of the first filter, HB1. Similarly, a third cascaded filter, HB3, inserts zeros between the output samples of the second sub-filter HB2 before producing its output, $u(n)$, which generates a signal with spectral amplitude vs. frequency characteristic $U(\omega)$, with low frequency components 216 and high-frequency components 218. These frequency components are separated by even greater bandwidth, and the upper frequency portion, 218, can be easily removed by a low-pass sub-filter with a still longer transition bandwidth, 220. Such sub-filters might be implemented with 7 taps and 4 delays.

Filters with flat pass bands, flat stop bands, and narrow transition bandwidths are usually implemented with $(\sin x)/x$ impulse response functions multiplied by a suitable weighting function to remove the Gibbs phenomenon at the transition frequency, as is well understood in the art. However, other impulse response functions are well within the broad scope of the present invention.

Figure 3:
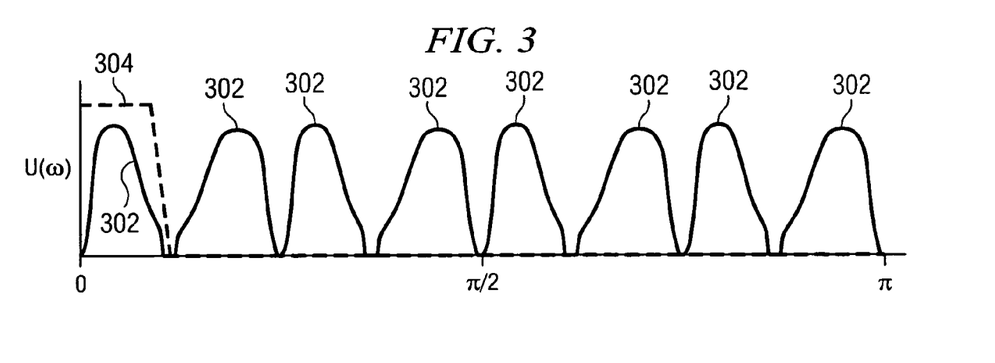
FIG. 3 illustrates an amplitude spectrum of an interpolated signal after insertion of seven zeros in one step between signal samples.

A cascade arrangement of simpler sub-filters offers substantial reduction in the digital computation because the more complex cascaded sub-filters in such a process are operated at lower repetition rates. Only the simplest sub-filter that produces the output signal in the cascade arrangement is operated at the highest repetition rate. If the interpolation filtering process were performed in one step, for example, by inserting seven zeros between each input sample for a one-step upsampling rate of eight to one, a spectral characteristic, such as the exemplary spectrum 302 illustrated in FIG. 3, would be produced, with eight compressed and alternately mirrored images of the original signal spectral characteristic, requiring a complex filter with a narrow transition bandwidth such as the filter gain characteristic 304, operating at the high repetition rate of the output signal $u(n)$.

Figure 4A:
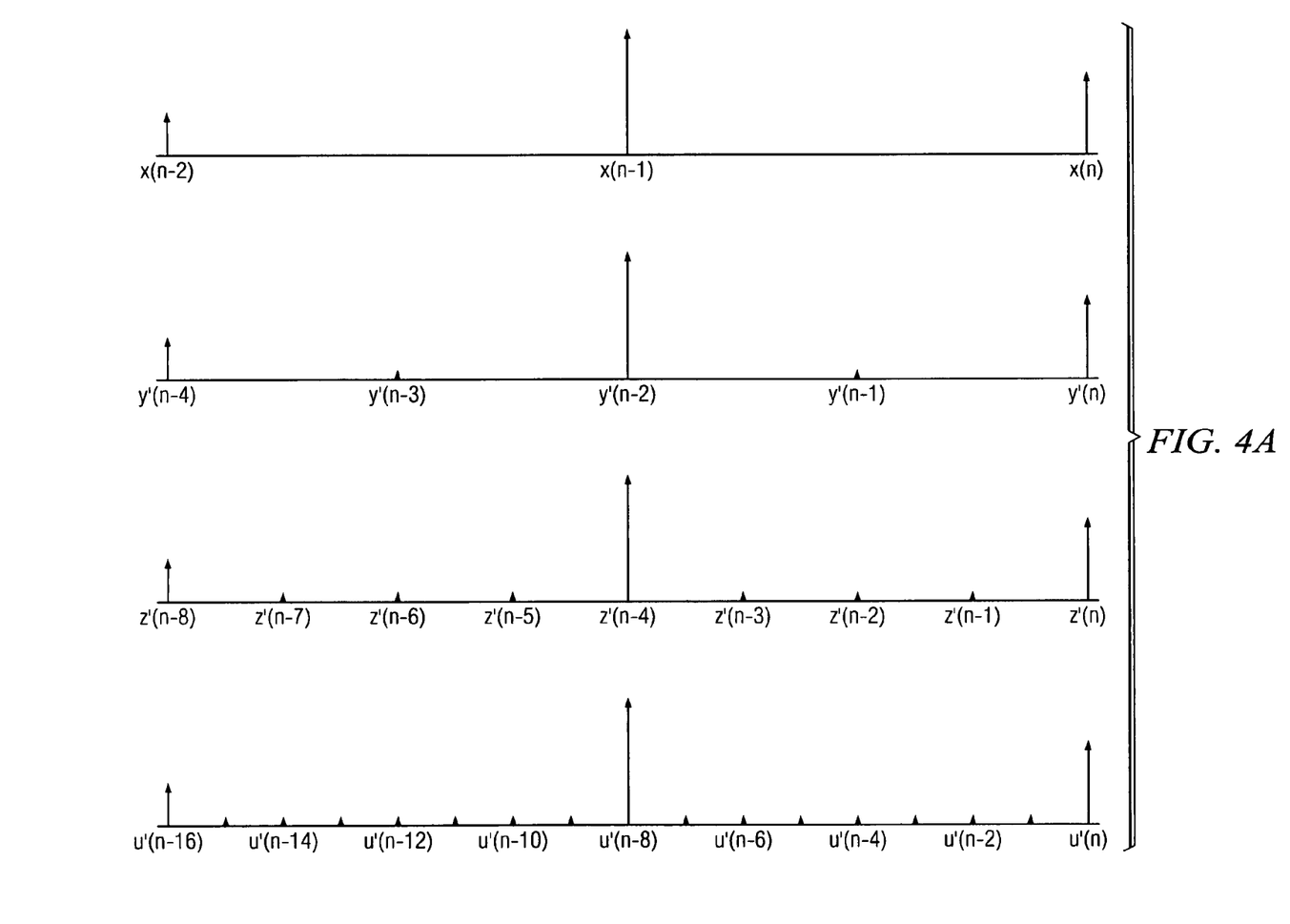
FIG. 4A illustrates a sampled signal after successively inserting zeros between signal samples.

The cascaded interpolation of an input signal $x(n)$ to produce an output signal $u(n)$ that is upsampled at a rate that is eight times that of the original input signal $x(n)$ is further illustrated in FIG. 4A, showing a sample of the input signal $x(n)$ and two prior samples, $x(n-1)$ and $x(n-2)$. Zeros are inserted between the samples of $x(n)$ to produce the upsampled but unfiltered signal $y'(n)$. Zeros are further inserted between the samples of the signal $y'(n)$ to produce the unfiltered signal $z'(n)$, which is then upsampled at a rate that is four times that of the original input signal $x(n)$. The process of inserting zeros is repeated to produce the unfiltered signal $u'(n)$, which is now upsampled at a rate that is eight times that of the original input signal $x(n)$.

Figure 4B:
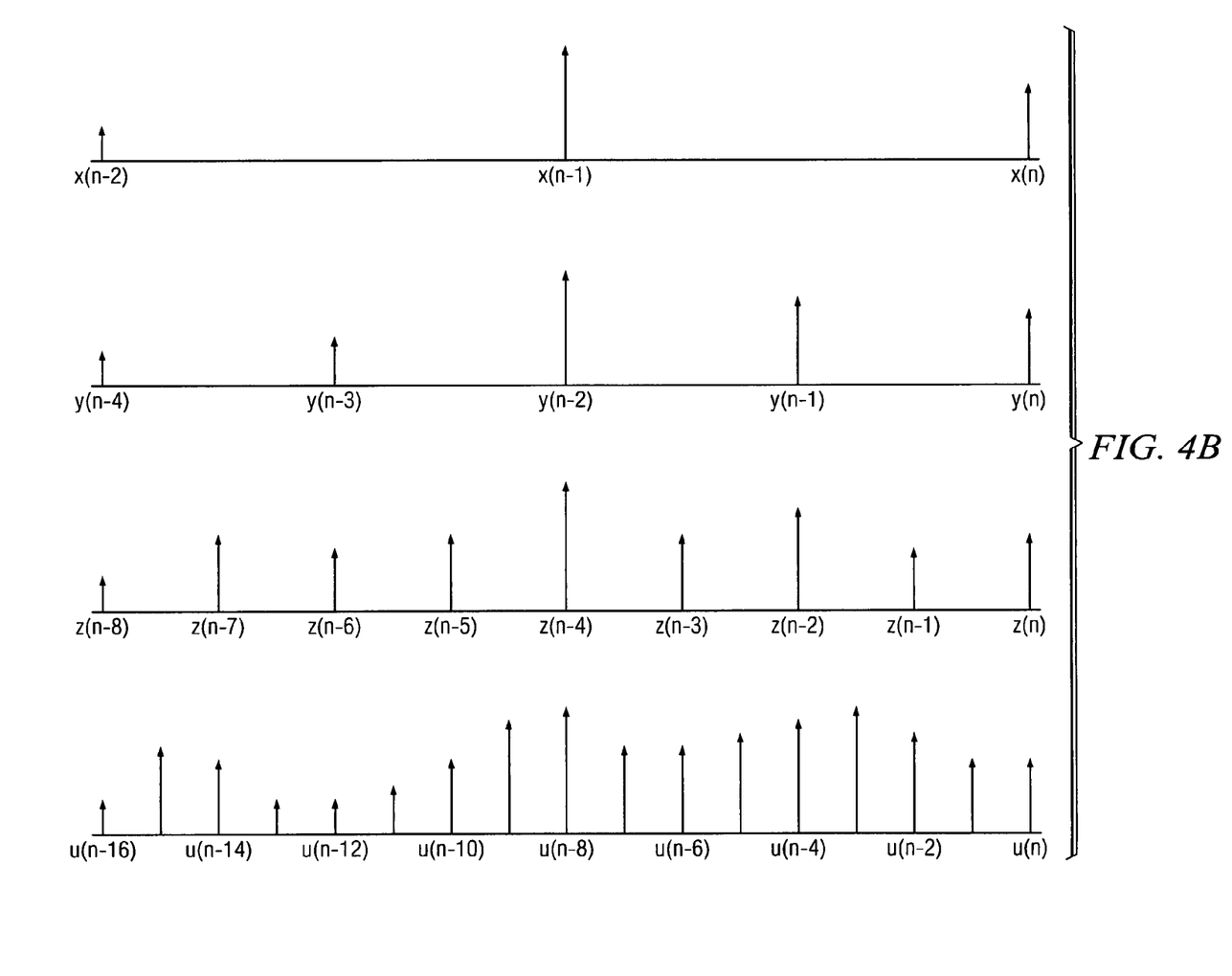
FIG. 4B illustrates a sampled signal after successively inserting zeros between signal samples with filtering.

FIG. 4B illustrates the signals $y(n)$, $z(n)$, and $u(n)$ after filtering by the respective half-band sub-filters HB1, HB2, and HB3. The signal samples that were inserted as zeros between the original sampling points now typically assume nonzero values as a consequence of the filtering processes. The resulting filtered but oversampled signals retain the information content of the original signal $x(n)$ and can be faithfully converted with fewer bits of precision in D/A converters.

Figure 5:
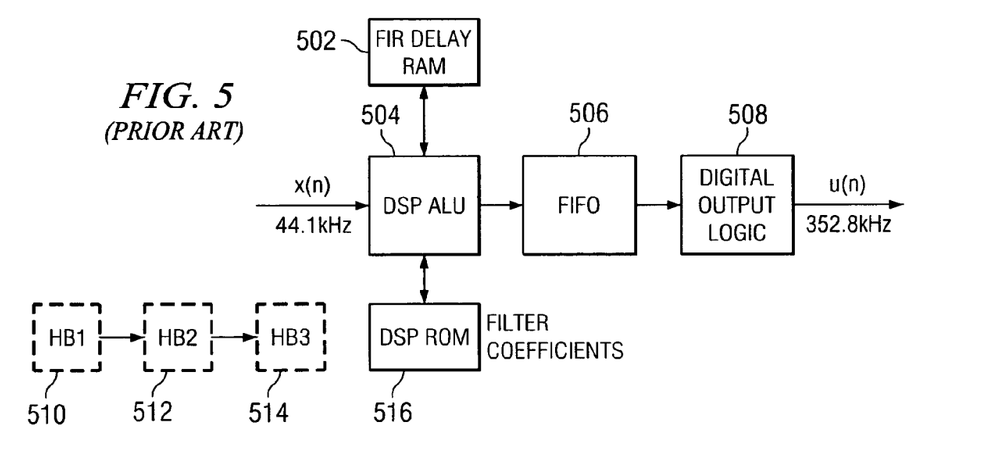
FIG. 5 illustrates an exemplary structure of a cascaded interpolation filter of the prior art.

FIG. 5 illustrates an exemplary configuration of an interpolation filter of the prior art with its attendant requirement for substantial device area for a FIFO memory for its implementation. A digital signal processing arithmetic and logic unit (DSP ALU) 504 performs the digital filtering computation for an input signal $x(n)$ to be interpolated. A FIR delay random-access memory (FIR Delay RAM) 502 stores successive samples of an input signal $x(n)$ and successive samples of the cascaded, filtered signals $y(n)$, $z(n)$, and $u(n)$. The RAM 502 is configured as a "circularly" addressed memory in which successive signal samples are stored in successive memory locations to implement delay. The memory storage process starts again at the first memory location when a designated last memory location is filled. A "pointer" is used to identify the current sample in this circularly addressed memory arrangement. The filter coefficients are stored in a digital signal processing read-only memory (DSP ROM) 516, and the output signal samples are read at the correct time from a first in-first out (FIFO) memory 506 under control of the digital output logic ("glue logic") 508. DSP ALU 504 executes the filters and writes output signal samples as they become ready into FIFO memory 506 independent of output requirements. Digital output ("glue logic") 508 reads from the FIFO memory 506 as per output requirements. The DSP ALU 504 executes the cascaded sub-filters HB1, HB2, and HB3, in order respectively, as indicated in the figure by the sequence of sub-filter blocks with dotted outlines 510, 512, and 514, because of the interdependence of the cascaded stages.

Figure 6:
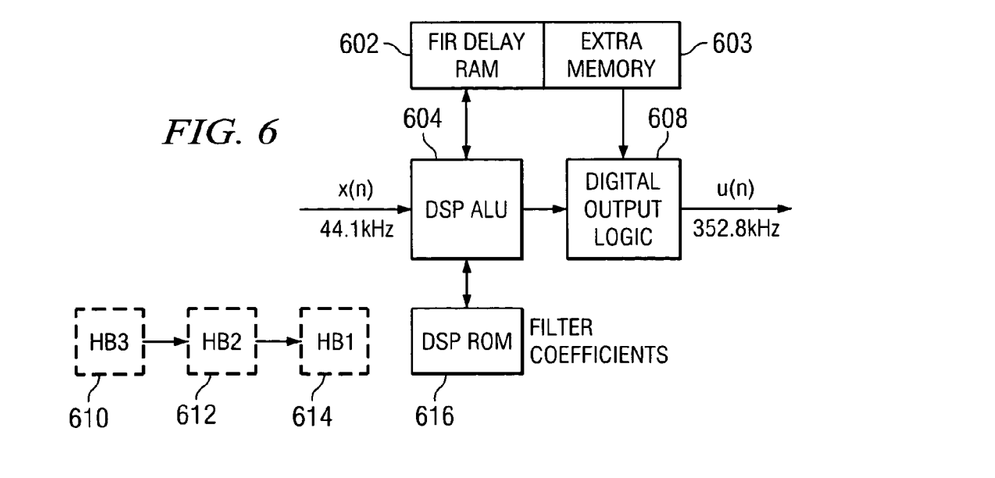
FIG. 6 illustrates an exemplary structure of a cascaded interpolation filter of the present invention.

Turning now to FIG. 6, illustrated is an exemplary configuration of an interpolation filter of the present invention without the requirement of a FIFO memory for its implementation. A DSP ALU 604 is the digital signal processing engine in this example that performs the digital filtering computation for an input signal $x(n)$. Of course, a general purpose microprocessor or an ASIC can alternatively be used to perform the digital filtering computation. An FIR Delay RAM 602 with extra memory 603 stores successive samples of the input signal $x(n)$ and successive samples of the cascaded, filtered signals $y(n)$, $z(n)$, and $u(n)$. The RAM 602/603 may be configured as a circularly addressed memory in which successive signal samples are stored in successive memory locations with a pointer to identify the current signal sample. The filter coefficients are stored in DSP ROM 616. However, in the cascaded sequence of sub-filters of the present invention, the sub-filters are operated in the reverse order from the prior art, as indicated in the figure by the half-band sub-filter HB3 (610) being operated before half-band sub-filter HB2 (612), which in turn is operated before half-band sub-filter HB1 (614). Ordinarily, operation of these sub-filters in reverse order is not possible because the input signals for half-band sub-filter HB2 depend on the output of half-band sub-filter HB1, and the input signals for half-band sub-filter HB3 depend on the output from half-band sub-filter HB2. The operation of the cascaded sub-filters of the present invention is performed using the output of half-band sub-filter HB1 from the previous sampling cycle as the input to half-band sub-filter HB2. Similarly, the output of half-band sub-filter HB2 from its previous sampling cycle is used as the input to half-band sub-filter HB3. In this manner, the output samples that are required quickly are computed first, which provides the essential simplification to the structure of the process that supplies the output data. The overall effect in the filtering process of the present invention is a small but unimportant delay that is on the order of several times the reciprocal bandwidth of the original input signal. This filtering arrangement of reversing the order of execution of the filtering stages avoids the need for expensive, area consuming, dual-port FIFO memory to supply the output data. The present invention preferably uses a multiply-and-accumulate (MAC) engine to write the filtering results to memory, and an output stage to read the results, which can be performed without a timing conflict. A common memory space is used with a pointer to the next output signal sample. The filtering process can be halted for one clock period at the time designated for the output stage to provide a filtered output sample.

Adding a small, fixed delay to the filtering process usually has no perceptible effect in most digital signal processing applications and does not degrade the quality of the filtered output signal. Small, unknown, and even variable delays are inherent in most physical situations, such as the small, inherent propagation delay associated with transmitting speech through air when listening to another person talking, or the small, inherent propagation delay when listening to a radio signal transmitted over a substantial and usually unknown distance. Such delays, per se, usually do not affect the quality or information content of the received signal because of the absence of an absolute time reference in the process.

Figure 7:
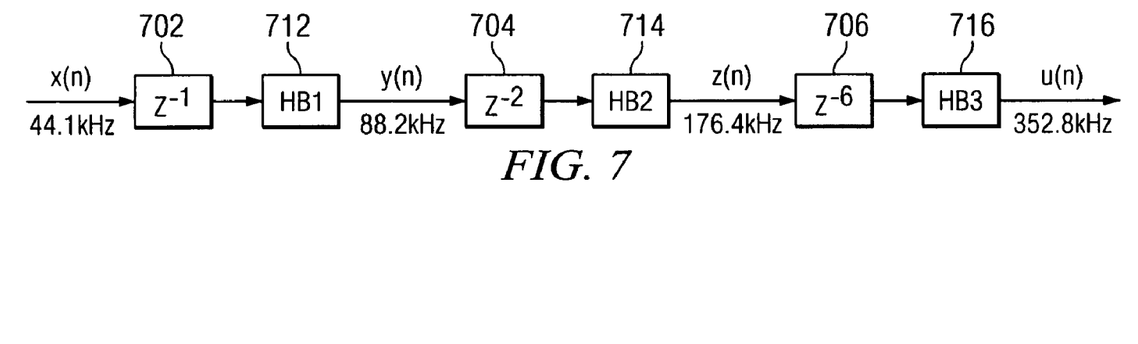
FIG. 7 illustrates a block diagram of the insertion of delays between cascaded filter stages of the present invention.

FIG. 7 illustrates an exemplary block diagram of an interpolation filter of the present invention operating on the prior-cycle results of the previous filtering stage. A delay of one sample cycle, represented by the Z-transform $Z^{-1}$ in block 702, is applied to the input signal $x(n)$ that is coupled to the half-band sub-filter HB1 in block 712 that produces the filtered signal $y(n)$ at twice the sampling rate of $x(n)$. Two cycles of delay are applied by the block 704 to the filtered signal $y(n)$ that is supplied to the half-band sub-filter HB2 in block 714 that produces the filtered signal $z(n)$ at four times the sampling rate of $x(n)$. Correspondingly, six cycles of delay are applied by the block 706 to the filtered signal $z(n)$ that is supplied to the half-band sub-filter HB3 in block 716 that produces the filtered signal $u(n)$ at eight times the sampling rate of $x(n)$. The process of adding purposeful delays to the filtered signal samples guarantees computational independency of the successive filtering stages and allows their computation to be performed in reverse order, i.e., the actual digital computation in the filtering process is performed opposite to the signal flow illustrated in FIG. 7. The delays required depend on the actual filter orders being used to guarantee the computational independency between filter stages. The delays used herein work for the filter orders being mentioned. By running the half-band sub-filter HB3 first, its output samples are available when needed and can be read without the need for a FIFO memory. A further consequence of the added delays is the need for a small increase in random-access memory for the signal samples represented by the block 603 in FIG. 6 to store the extra signal samples necessitated by introducing the delays. Such memory can be easily added to the existing RAM used for the sample delays. Adding a few extra memory locations to an existing memory macro is always a low-cost alternative to adding an extra macro in silicon design.

Figure 8:
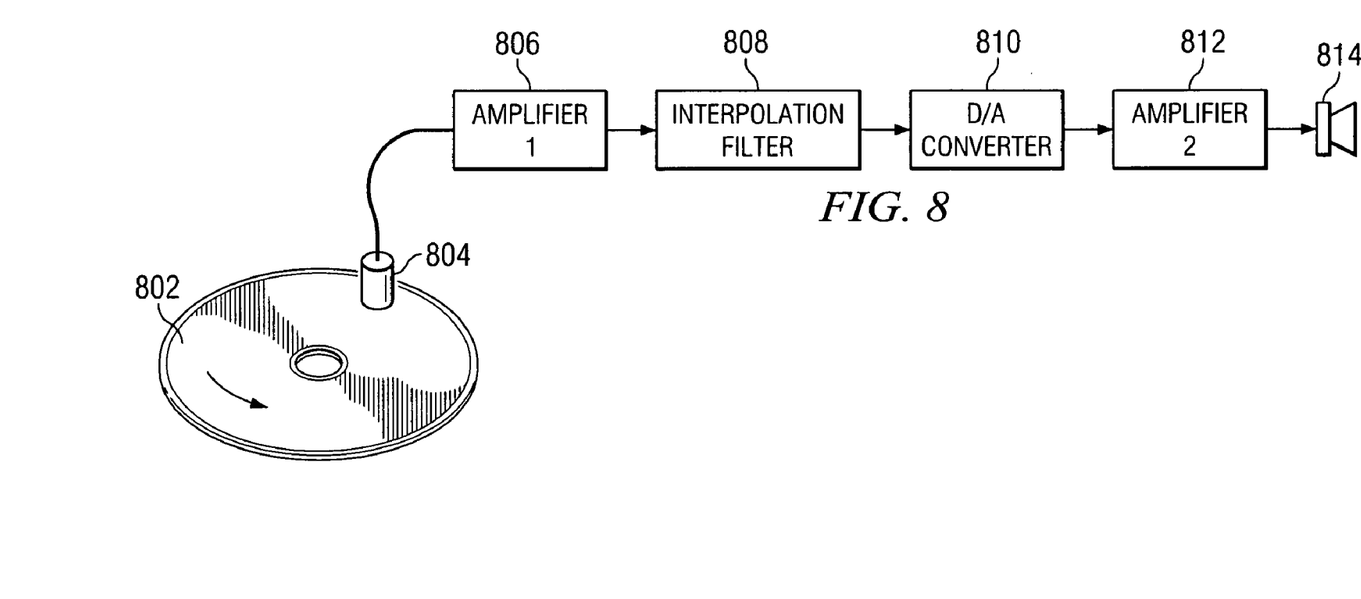
FIG. 8 illustrates an audio reproduction system configured with an interpolation filter of the present invention.

FIG. 8 illustrates a sound reproduction system configured with a digital interpolation filter of the present invention. This exemplary system is configured with a CD reader in which a digital signal on CD 802, typically recorded with 16 bits of precision at a sampling rate of 44.1 kHz, is sensed by an optical device 804 and amplified by a first amplifier 806. The amplified digital signal is interpolated by a digital interpolation filter of the present invention to a higher sampling rate, such as 176.4 or 352.8 kHz, depending on the particular system design, using the digital interpolation filter 808. The upsampled digital signal is then converted by the D/A converter 810 to an analog signal, which is amplified by the second amplifier 812 and converted to sensible sound waves by the loudspeaker 814. The inclusion of the upsampling process performed with interpolation filter 808 enables a D/A converter to be used with fewer bits of precision without compromising the fidelity of the original audio signal. Upsampling and D/A conversion with reduced bits of precision to reduce cost is a frequent design choice for high performance systems. Although only one audio channel is shown in the figure, multiple channels such as left and right audio channels, each with its own digital interpolation filter, are usually implemented in such a system.

The design and implementation of digital interpolation and decimation filters is described in R. A. Haddad, et al., "Digital Signal Processing," W. H. Freeman and Co., 1991, pp. 202-234, which is hereby referenced and incorporated herein.

Although embodiments of the present invention and its advantages have been described in detail, it should be understood that various changes, substitutions and alterations can be made herein without departing from the spirit and scope of the invention as defined by the appended claims. For example, it will be readily understood by those skilled in the art that the circuits, circuit elements, digital filters, and utilization of techniques to form the processes and systems providing increased efficiency of calculation of filtered signals as described herein may be varied while remaining within the broad scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A digital signal processing filter configured to alter the sampling rate of a sampled input signal and produce a filtered output signal, comprising:
 a digital signal processing engine;
 a random-access memory configured to store the filtered output signal;
 a cascade arrangement of sub-filters that is executed by the digital signal processing engine and that stores the results in the random-access memory, wherein each sub-filter is configured to provide a sampling rate altering step that produces a filtered signal at a successively higher sampling rate, and wherein the sub-filter that generates the filtered output signal is executed first, using data from a previous sampling interval; and
 digital output logic configured to output the filtered output signal.

2. The digital signal processing filter according to claim 1, wherein the sampling rate is altered by interpolation.

3. The digital signal processing filter according to claim 1, wherein the sub-filters are configured as finite-time impulse response filters.

4. The digital signal processing filter according to claim 1, wherein the data from a previous sampling interval is sufficiently delayed to provide computational independence of the sub-filters.

5. The digital signal processing filter according to claim 1, wherein the digital signal processing engine is configured with a microprocessor.

6. The digital signal processing filter according to claim 1, wherein the digital signal processing engine and the random-access memory are configured with an application- specific integrated circuit.

7. The digital signal processing filter according to claim 1, wherein the digital signal processing engine is halted to enable the digital output logic to output the filtered output signal.

8. A signal processing system configured with a digital signal processing filter that alters the sampling rate of a sampled input signal and produces a filtered output signal, comprising:
 a digital signal processing engine;
 a random-access memory configured to store the filtered output signal;
 a cascade arrangement of sub-filters that is executed by the digital signal processing engine and that stores the results in the random-access memory, wherein each sub-filter is configured to provide a sampling rate altering step that produces a filtered signal at a successively higher sampling rate, wherein the sub-filter that generates the filtered output signal is executed first, using data from a previous sampling interval;
 digital output logic configured to output the filtered output signal;
 a digital-to-analog converter to convert the filtered output signal to an analog form;
 an amplifier to amplify the signal converted to analog form; and
 a transducer to convert the amplified signal to a sensible form.

9. The signal processing system according to claim 8, wherein the sampling rate is altered by interpolation.

10. The signal processing system according to claim 8, wherein the sub-filters are configured as finite-time impulse response filters.

11. The signal processing system according to claim 8, wherein the data from a previous sampling interval is sufficiently delayed to provide computational independence of the sub-filters.

12. The signal processing system according to claim 8, wherein the digital signal processing engine is halted to enable the digital output logic to output the filtered output signal.

13. The signal processing system according to claim 8, wherein the digital signal processing engine is configured with a microprocessor.

14. The signal processing system according to claim 8, wherein the digital signal processing engine and the random-access memory are configured with an application-specific integrated circuit.

15. A method of altering the sampling rate of a sampled input signal to produce a filtered output signal comprising:
 configuring a random-access memory to store the filtered output signal;
 operating a cascade arrangement of sub-filters with a digital signal processing engine, using each sub-filter to provide a sampling rate altering step that produces a filtered signal at a successively higher sampling rate, running the sub-filter that generates the filtered output signal first using data from a previous sampling interval, and storing the results in the random-access memory; and
 operating digital output logic to output the filtered output signal.

16. The method according to claim 15, including altering the sampling rate by interpolation.

17. The method according to claim 15, including delaying the data from a previous sampling interval sufficiently to provide computational independence of the sub-filters.

18. The method according to claim 15, including configuring the digital signal processing engine with a microprocessor.

19. The method according to claim 15, including configuring the digital signal processing engine and the random-access memory with an application-specific integrated circuit.

20. The method according to claim 15, including interrupting the digital signal processing engine to enable the digital output logic to output the filtered output signal.

* * * * *